United States Patent
Wu et al.

(10) Patent No.: US 9,838,023 B2
(45) Date of Patent: Dec. 5, 2017

(54) SLOW-CLOCK CALIBRATION METHOD AND UNIT, CLOCK CIRCUIT, AND MOBILE COMMUNICATION TERMINAL

(71) Applicant: Spreadtrum Communications (Shanghai) Co., Ltd., Shanghai (CN)

(72) Inventors: Geming Wu, Shanghai (CN); Zhi Zhang, Shanghai (CN)

(73) Assignee: SPREADTRUM COMMUNICATIONS (SHANGHAI) CO., LTD., Shanghai (CN)

( * ) Notice: Subject to any disclaimer, the term of this patent is extended or adjusted under 35 U.S.C. 154(b) by 170 days.

(21) Appl. No.: 14/925,128

(22) Filed: Oct. 28, 2015

(65) Prior Publication Data

US 2016/0182057 A1 Jun. 23, 2016

(30) Foreign Application Priority Data

Dec. 18, 2014 (CN) .......................... 2014 1 0802125

(51) Int. Cl.
| | |
|---|---|
| *H03L 1/00* | (2006.01) |
| *H03L 1/02* | (2006.01) |
| *H04W 56/00* | (2009.01) |
| *H03B 5/32* | (2006.01) |
| *G01R 21/00* | (2006.01) |
| *H03B 5/36* | (2006.01) |

(52) U.S. Cl.
CPC .............. *H03L 1/027* (2013.01); *G01R 21/00* (2013.01); *H03B 5/32* (2013.01); *H03B 5/362* (2013.01); *H03B 5/366* (2013.01); *H03L 1/022* (2013.01); *H04W 56/001* (2013.01)

(58) Field of Classification Search
CPC .. G01R 21/00; H03L 1/02; H03L 1/20; H03L 1/022; H03L 1/027; H03B 5/32; H03B 5/363; H03B 5/366; H04W 56/001
USPC .................. 331/158, 176, 116 FE; 324/76.11
See application file for complete search history.

(56) References Cited

U.S. PATENT DOCUMENTS

2013/0285640 A1* 10/2013 Yamada .................... H03L 1/02
324/76.11

* cited by examiner

*Primary Examiner* — Arnold Kinkead
(74) *Attorney, Agent, or Firm* — Vierra Magen Marcus LLP

(57) ABSTRACT

A slow-clock calibration method, a slow-clock calibration unit, a clock circuit and a mobile communication terminal are provided. The calibration method includes: obtaining a current temperature of the crystal; searching a unique frequency-divide coefficient corresponding to the current temperature from a preset data base; if the coefficient is found in the data base, inputting the unique coefficient into a frequency divider; if the coefficient is not found in the data base, obtaining an actual sleep length of the mobile communication terminal, if the actual sleep length is not equal to a required sleep length, calculating a required frequency-divide coefficient and updating the data base with the required frequency-divide coefficient, and if the actual sleep length of the mobile communication terminal is equal to the required sleep length, updating the data base with a current frequency-divide coefficient. Accordingly, slow-clock calibration is realized with reduced crystal costs.

13 Claims, 3 Drawing Sheets

US 9,838,023 B2

1

SLOW-CLOCK CALIBRATION METHOD AND UNIT, CLOCK CIRCUIT, AND MOBILE COMMUNICATION TERMINAL

CROSS-REFERENCE TO RELATED APPLICATIONS

The present application claims priority to Chinese patent application No. 201410802125.6, filed on Dec. 18, 2014, and entitled "SLOW-CLOCK CALIBRATION METHOD AND UNIT, CLOCK CIRCUIT, AND MOBILE COMMUNICATION TERMINAL", the entire disclosure of which is incorporated herein by reference.

TECHNICAL FIELD

The present disclosure generally relates to mobile communication technology, and more particularly, to a slow-clock calibration method, a slow-clock calibration unit, a clock circuit, and a mobile communication terminal.

BACKGROUND

A mobile communication terminal generally has two clocks, a high-frequency clock and a slow clock. The high-frequency clock is configured to realize timing control during an operating mode of the mobile communication terminal. The slow clock is configured to realize timing control during a standby mode of the mobile communication terminal, such that the mobile communication terminal can periodically awake from the standby mode to receive paging requests.

Referring to FIG. 1, a conventional clock circuit configured in a mobile communication terminal is illustrated. The clock circuit includes two crystals (which are respectively labeled as S1 and S2 in FIG. 1), and two oscillating circuits (which are respectively labeled as Z1 and Z2 in FIG. 1). The two crystals are independently used in different oscillating circuits (e.g. the crystal S1 is used in the oscillating circuit Z1, and the crystal S2 is used in the oscillating circuit Z2), for generating a high-frequency clock signal and a slow-clock signal, respectively. The clock circuit may further include a slow-clock calibration unit (which is labeled as J1 in FIG. 1). The slow-clock calibration unit J1 is adapted to realize slow-clock calibration by taking the high-frequency clock as a reference. Specifically, the slow-clock calibration unit J1 counts how many cycles the high-frequency clock has been through within a predetermined number of cycles of the slow clock, under circumstance that the two oscillating circuits (i.e. Z1 and Z2) are both on operation. As such, the slow clock can be calibrated with reference to the precise high frequency clock.

Currently, in some solutions, a modified clock circuit has been proposed in order to reduce product costs. The modified clock circuit includes only one crystal and correspondingly one oscillating circuit, plus a frequency divider F1, as shown in FIG. 2. Specifically, the frequency divider F1 is configured to divide a frequency output from the oscillating circuit Z1, thus obtaining a high-frequency clock signal when the mobile communication terminal is in the operating mode, and obtaining a slow-clock signal when the mobile communication terminal is in the standby mode. It can be seen that, the frequency divider F1 is unable to obtain the high-frequency clock signal and the slow-clock signal at the same time. As a result, the slow clock can not be calibrated by taking the high-frequency clock as a reference via the

2 aforementioned way. Therefore, a solution of realizing slow-clock calibration is on the demand.

SUMMARY

One object of the present disclosure is to provide a slow-clock calibration method, a slow-clock calibration unit, a clock circuit and a mobile communication terminal which are adapted to achieve slow-clock calibration with reduced crystal costs.

According to one embodiment of the present disclosure, a slow-clock calibration method for a clock circuit of a mobile communication terminal is provided, where the clock circuit includes a crystal, an oscillating circuit and a frequency divider. The slow-clock calibration method includes: obtaining a current temperature of the crystal; searching, by taking a value of the current temperature as an index value, a preset data base for an unique frequency-divide coefficient corresponding to the current temperature of the crystal; if the unique frequency-divide coefficient corresponding to the current temperature of the crystal is found in the data base, inputting the unique frequency-divide coefficient into the frequency divider; and if the unique frequency-divide coefficient corresponding to the current temperature of the crystal is not found in the data base, obtaining an actual sleep length of the mobile communication terminal when the mobile communication terminal is awake and in synchronization with a base station, if the actual sleep length of the mobile communication terminal is not equal to a required sleep length, calculating a required frequency-divide coefficient of the frequency divider under the current temperature and updating the data base with the required frequency-divide coefficient, and if the actual sleep length of the mobile communication terminal is equal to the required sleep length, updating the data base with a current frequency-divide coefficient used by the frequency divider.

In some embodiments, calculating the required frequency-divide coefficient includes calculating the required frequency-divide coefficient according to Equation (1):

$$k\_cal = k\_def * T\_req / T\_real \qquad \text{Equation (1)}$$

where $k\_def$ represents the current frequency-divide coefficient used by the frequency divider; $T\_req$ represents the required sleep length of the mobile communication terminal; $T\_real$ represents the actual sleep length of the mobile communication terminal; and $k\_cal$ represents the required frequency-divide coefficient of the frequency divider under the current temperature.

According to one embodiment of the present disclosure, a slow-clock calibration unit for a clock circuit of a mobile communication terminal is provided, where the clock circuit includes a crystal, an oscillating circuit and a frequency divider. The slow-clock calibration unit includes: a temperature-acquiring unit configured to obtain a current temperature of the crystal; a searching unit configured to search, by taking a value of the current temperature as an index value, a preset data base for a unique frequency-divide coefficient corresponding to the current temperature of the crystal; a first processing unit configured to: if the unique frequency-divide coefficient corresponding to the current temperature of the crystal is found in the data base, input the unique frequency-divide coefficient into the frequency divider; and a second processing unit configured to: if the unique frequency-divide coefficient corresponding to the current temperature of the crystal is not found in the data base, obtain an actual sleep length of the mobile communication terminal when the mobile communication terminal is awake and in synchronization with a base station, if the actual sleep length of the mobile communication terminal is not equal to a required sleep length, calculate a required frequency-divide coefficient of the frequency divider under the current temperature and update the data base with the required frequency-divide coefficient, and if the actual sleep length of the mobile communication terminal is equal to the required sleep length, update the data base with a current frequency-divide coefficient used by the mobile communication terminal.

In some embodiments, the second processing unit calculates the required frequency-divide coefficient according to Equation (1):

$$k\_cal = k\_def * T\_req / T\_real \qquad \text{Equation (1)}$$

where k_def represents the current frequency-divide coefficient used by the frequency divider; T_req represents the required sleep length of the mobile communication terminal; T_real represents the actual sleep length of the mobile communication terminal; and k_cal represents the required frequency-divide coefficient of the frequency divider under the current temperature.

According to one embodiment of the present disclosure, a clock circuit of a mobile communication terminal is provided. The clock circuit includes: a crystal; an oscillating circuit; a frequency divider; a temperature measuring module configured to measure and output a current temperature of the crystal; an analog-to-digital converter electrically connected with the temperature measuring module; and a logic controller which electrically connects the analog-to-digital converter with the frequency divider and is configured to: obtain the current temperature of the crystal, search, by taking a value of the current temperature as an index value, a preset data base for a unique frequency-divide coefficient corresponding to the current temperature of the crystal, if the unique frequency-divide coefficient corresponding to the current temperature of the crystal is found in the data base, input the unique frequency-divide coefficient into the frequency divider, and if the unique frequency-divide coefficient corresponding to the current temperature of the crystal is not found in the data base, obtain an actual sleep length of the mobile communication terminal when the mobile communication terminal is awake and in synchronization with a base station, if the actual sleep length of the mobile communication terminal is not equal to a required sleep length, calculate a required frequency-divide coefficient of the frequency under the current temperature and update the data base with the required frequency-divide coefficient, and if the actual sleep length of the mobile communication terminal is equal to the required sleep length, update the data base with a current frequency-divide coefficient used by the mobile communication terminal.

In some embodiments, the temperature measuring module includes a first resistor and a second resistor; wherein the second resistor is a thermo-sensitive resistor disposed close to or attached to the crystal; wherein the second resistor has a first end connected to ground, and a second end connected with a power source via the first resistor; and wherein the first resistor and the second resistor have a common end which serves as an output end of the temperature measuring module.

In some embodiments, the oscillating circuit includes a capacitor, an inductor, a third resistor, a current source and a triode; wherein an output terminal of the current source is connected with a collector of the triode, and is connected with a base of the triode via the inductor; wherein an emitter of the triode is connected to ground; and wherein the capacitor and the inductor are connected in parallel.

In some embodiments, the crystal is a 26M high frequency crystal; and wherein the frequency divider has an initial frequency-divide coefficient of 26/32*1000.

According to one embodiment of the present disclosure, a mobile communication terminal is provided. The mobile communication terminal includes a clock circuit which includes: a crystal; an oscillating circuit; a frequency divider; a temperature measuring module configured to measure and output a current temperature of the crystal; an analog-to-digital converter connected with the temperature measuring module; and a logic controller which connects the analog-to-digital converter with the frequency divider and is configured to: obtain the current temperature of the crystal, search, by taking a value of the current temperature as an index value, a preset data base for a unique frequency-divide coefficient corresponding to the current temperature of the crystal, if the unique frequency-divide coefficient corresponding to the current temperature of the crystal is found in the data base, input the unique frequency-divide coefficient into the frequency divider, and if the unique frequency-divide coefficient corresponding to the current temperature of the crystal is not found in the data base, obtain an actual sleep length of the mobile communication terminal when the mobile communication terminal is awake and in synchronization with a base station, if the actual sleep length of the mobile communication terminal is not equal to a required sleep length, calculate a required frequency-divide coefficient of the frequency divider under the current temperature and update the data base with the required frequency-divide coefficient, and if the actual sleep length of the mobile communication terminal is equal to the required sleep length, update the data base with a current frequency-divide coefficient used by the mobile communication terminal.

In some embodiments, the temperature measuring module includes a first resistor and a second resistor; wherein the second resistor is a thermo-sensitive resistor disposed close to or attached to the crystal; wherein the second resistor has a first end connected to ground, and second end connected with a power source via the first resistor; and wherein the first resistor and the second resistor have a common end which serves as an output end of the temperature measuring module.

In some embodiments, the oscillating circuit includes a capacitor, an inductor, a third resistor, a current source and a triode; wherein an output terminal of the current source is connected with a collector of the triode, and is connected with a base of the triode via the inductor; wherein an emitter of the triode is connected to ground; and wherein the capacitor and the inductor are connected in parallel.

In some embodiments, the crystal is a 26M high frequency crystal; and wherein the frequency divider has an initial frequency-divide coefficient of 26/32*1000.

In some embodiments, the mobile communication terminal is a cell phone.

Accordingly, in the present disclosure, given an oscillating frequency of the crystal varies with a temperature, a data base (e.g. a frequency-divide coefficient table) can be established, where the data base indicates a correlation between temperatures of the crystal and frequency-divide coefficients. Therefore, a frequency-divide coefficient corresponding to a current temperature of the crystal, i.e., the required frequency-divide coefficient, can be found in the data base (e.g. the frequency-divide coefficient table) by taking a value of the current temperature as an index value. Thereafter, the frequency-divide coefficient found in the data base (e.g. the frequency-divide coefficient table) is input into the frequency divider. Thus, the frequency divider can obtain a low-clock signal with a desired frequency. In such a way, a temperature based slow-clock calibration process can be realized by using the crystal itself without requiring an extra crystal. Therefore, costs of the crystal can be reduced.

DETAILED DESCRIPTION

In order to clarify the objects, characteristics and advantages of the present disclosure, embodiments of the present disclosure will be described in detail in conjunction with the accompanying drawings. The disclosure will be described with reference to certain embodiments. Accordingly, the present disclosure is not limited to the embodiments disclosed. It will be understood by those skilled in the art that various changes may be made without departing from the spirit or scope of the disclosure.

Figure 1:
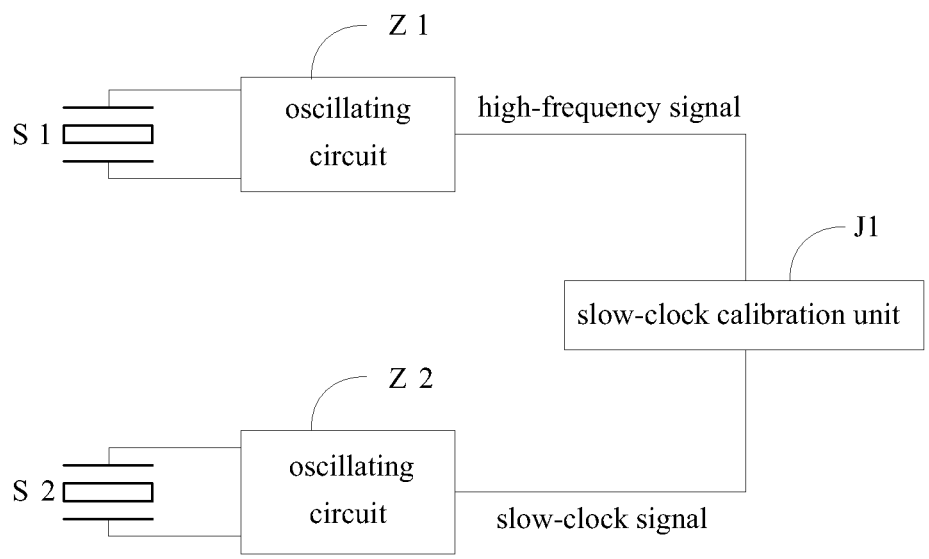
FIG. 1 schematically illustrates a structure of an existing clock circuit in a mobile communication terminal.
Figure 2:
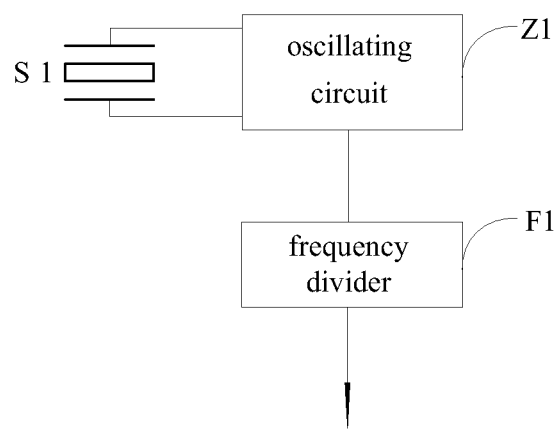
FIG. 2 schematically illustrates another structure of an existing clock circuit in a mobile communication terminal.
Figure 3:
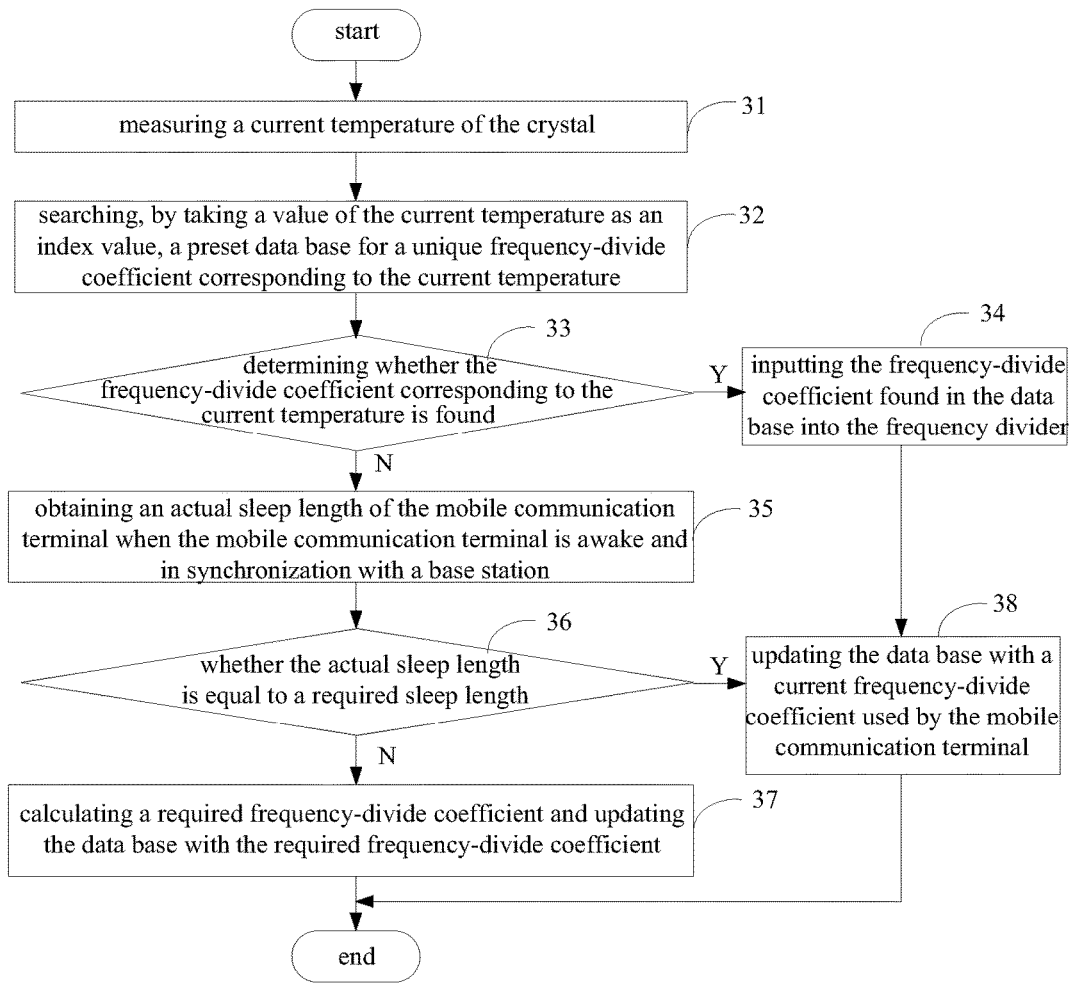
FIG. 3 schematically illustrates a flow chart of a slow-clock calibration method for a mobile communication terminal according to one embodiment of the present disclosure.

Referring to FIG. 3, a slow-clock calibration method for a mobile communication terminal according to one embodiment of the present disclosure is illustrated. The slow-clock calibration method is adapted to be applied to existing clock circuits (e.g. the existing clock circuit as shown in FIG. 2), for calibrating a slow clock in the mobile communication terminal with reduced crystal costs. The slow-clock calibration method includes following steps from step 31 to step 38.

In step 31, measuring a current temperature of a crystal (e.g. the crystal S1).

In step 32, searching, by taking a value of the current temperature as an index value, a preset data base for a unique frequency-divide coefficient corresponding to the current temperature.

In step 33, determining whether the unique frequency-divide coefficient corresponding to the temperature is found in the preset data base, if yes, implementing step 34, if not, implementing step 35.

In step 34, inputting the frequency-divide coefficient found in the preset data base into a frequency divider (e.g. the frequency divider F1). To this step, the slow-clock calibration can be achieved. In other words, the slow-clock calibration may be realized through step 31, step 32, step 33 and step 34.

Under an operating mode and a standby of the mobile communication terminal, oscillating frequencies correspondingly output from the oscillating circuit (e.g. the oscillating circuit Z1) therein are different from each other. Changes of the oscillating frequency is caused by two factors: one is parameter change of the oscillating circuit (e.g. the oscillating circuit Z1) due to switching between different modes; and the other one is temperature change of the crystal (e.g. the crystal S1), as an equivalent circuit of the crystal is subject to temperature change. It can be seen that, the oscillating frequency varies with the temperature change of the crystal.

When mobile communication terminal is in the standby mode, frequency output from a frequency divider (e.g. the frequency divider F1) is a frequency of slow-clock signal which can be used for calculating a sleep length of the mobile communication terminal. Thus, the mobile communication terminal is able to be control entering into the operating mode after a preset period of time (which is determined by the sleep length) for receiving paging requests. It can be understood that, if the frequency output from the frequency divide is too high or too low, the sleep length can not be calculated correctly. As a result, the mobile communication terminal can not enter into the operating mode at a correct time, thus may miss the paging requests.

Further, regarding the frequency divider (e.g. the frequency divider F1), a value of the frequency output from the frequency divider equals to a value of the oscillating frequency divided by a value of the frequency-divide coefficient (i.e. frequency output from the frequency divider=oscillating frequency/frequency-divide coefficient). Accordingly, when the value of the oscillating frequency changes with the temperature (temperature recited thereafter refers to the temperature of the crystal S1), the frequency output from the frequency divider may be too high or too low. As a result, the mobile communication terminal may miss the paging requests. In the present disclosure, through adjusting the value of the frequency-divide coefficient according to the temperature, the frequency output from the frequency divider is a constant value. As such, the mobile communication terminal can be controlled switching to the operating mode at a correct time. It should be noted that, in this case, the temperature and the frequency-divide coefficient correspond to each other in a one to one manner. In other words, regarding one temperature, there is only one corresponding frequency-divide coefficient, and regarding one frequency-divide coefficient, there is only one corresponding temperature.

Based on the one to one correlation between temperatures and frequency-divide coefficients, a frequency-divide coefficient table (i.e. a data base) can be established, wherein the frequency-divide coefficient table indicates the correlation between temperatures and frequency-divide coefficients. The temperatures in the table serve as index values, and each index value corresponds to a unique frequency-divide coefficient. Accordingly, a desired frequency-divide coefficient can be obtained based on the corresponding temperature and the table established. Thereafter, the frequency-divide coefficient obtained is input into a frequency divider, thus obtaining divided frequency which does not change with the temperature. As such, during the standby mode, the slow clock is adapted to maintain an effective sleep length based on which the mobile communication terminal can wakes periodically for receiving a paging request.

In step 35, when the mobile communication terminal is awake and in synchronization with a base station, obtaining an actual sleep length of the mobile communication terminal.

In step 36, determining whether the actual sleep length of the mobile communication terminal is equal to a required sleep length, if yes, implementing step 37, if no, implementing step 38.

In step 37, calculating a required frequency-divide coefficient of the frequency divider (e.g. the frequency divider F1) under the current temperature, and updating the data base with the required frequency-divide coefficient. To this step, the slow-clock calibration can be achieved. In other words, the slow-clock calibration may be realized through step 31, step 32, step 33, step 35, step 36 and step 37.

In step 38, updating the data base with a current frequency-divide coefficient currently used by the frequency divider (e.g. frequency divider F1). To this step, the slow-clock calibration can be achieved. In other words, the slow-clock calibration may be realized through step 31, step 32, step 33, step 35, step 36 and step 38.

When the mobile communication terminal wakes up, an empty synchronization is established between the mobile communication terminal and the base station, so as to obtain the actual sleep length. Thereafter, through comparing the actual sleep length and the required sleep length, it can be determined whether the frequency coefficient currently used by the frequency divider F1 is correct. Specifically, if the actual sleep length and the required sleep length are equal, it indicates that the current frequency-divide coefficient used by the frequency divider F1 is correct, thus no correction is needed. If the actual sleep length and the required sleep length are not equal, it indicates that the frequency coefficient currently used by the frequency divider F1 is incorrect, thus a correction process is needed. Accordingly, in the present disclosure, the correlation between temperatures and frequency-divide coefficients is constantly improved. Accordingly, required frequency-divide coefficients under different temperatures determined through step 35 to step 38 are stored in the data base, so as to make sure the frequency-divide coefficients corresponding to each temperature are correct. Thus, a temperature based slow-clock calibration is realized.

In some embodiments, when the actual sleep length and the required sleep length are not equal, the required frequency-divide coefficient of the frequency divider F1 under the current temperature is calculated according to Equation (1):

$$k\_cal = k\_def * T\_req / T\_real \qquad \text{Equation (1)}$$

where k_def represents the current frequency-divide coefficient of the frequency divider; T_req represents a required sleep length of the mobile communication terminal; T_real represents an actual sleep length of the mobile communication terminal; and k_cal represents a required frequency-divide coefficient of the frequency divider under the current temperature.

From above illustration, it can be seen that, given an oscillating frequency of the crystal varies with a temperature, a data base (e.g. a frequency-divide coefficient table) can be established, where the data base indicates a correlation between temperatures of the crystal and frequency-divide coefficients. Therefore, a frequency-divide coefficient corresponding to a current temperature of the crystal, i.e., the required frequency-divide coefficient, can be found in the data base (e.g. the frequency-divide coefficient table) by taking a value of the current temperature as an index value. Thereafter, the frequency-divide coefficient found in the data base (e.g. the frequency-divide coefficient table) is input into the frequency divider. Thus, the frequency divider can obtain a low-clock signal with a desired frequency. In such a way, a temperature based slow-clock calibration process can be realized by using the crystal itself without requiring an extra crystal. Therefore, costs of the crystal can be reduced.

Figure 4:
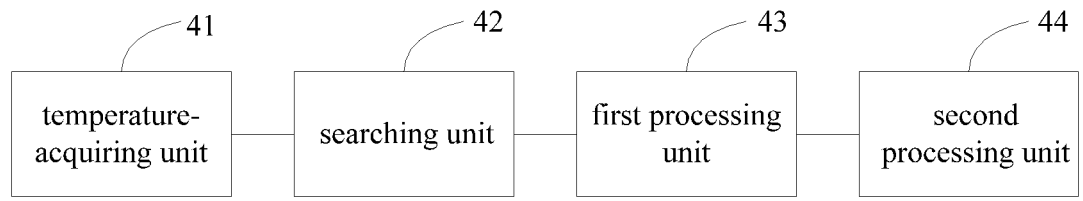
FIG. 4 schematically illustrates a structure of a slow-clock calibration unit for a mobile communication terminal according to one embodiment of the present disclosure.

Referring to FIG. 4, a slow-clock calibration unit of a clock circuit in a mobile communication terminal is illustrated, wherein the clock circuit includes one crystal, one oscillating circuit and one frequency divider. The slow-clock calibration unit provided by the present disclosure is adapted to achieve time calibration with reduced crystal costs. The slow-clock calibration unit includes: a temperature-acquiring unit 41, a searching unit 42, a first processing unit 43, and a second processing unit 44.

The temperature-acquiring unit 41 is configured to obtain a current temperature of the crystal.

The searching unit 42 is configured to search, by taking a value of the current temperature as an index value, a preset data base for a unique frequency-divide coefficient corresponding to the current temperature.

The first processing unit 43 is configured to: if the unique frequency-divide coefficient corresponding to the current temperature is found in the preset data base, input the unique frequency-divide coefficient into the frequency divider.

The second processing unit 44 is configured to: if the unique frequency-divide coefficient corresponding to the current temperature is not found in the preset data, obtain an actual sleep length of the mobile communication terminal after the mobile communication terminal is awake and in synchronization with a base station; if the actual sleep length is not equal to a required sleep length, calculate a required frequency-divide coefficient of the frequency divider under the current temperature, and update the data base according to the required frequency-divide coefficient; and if the actual sleep length is equal to the required sleep length, update the data base according to a current frequency-divide coefficient used by the frequency divider.

Figure 5:
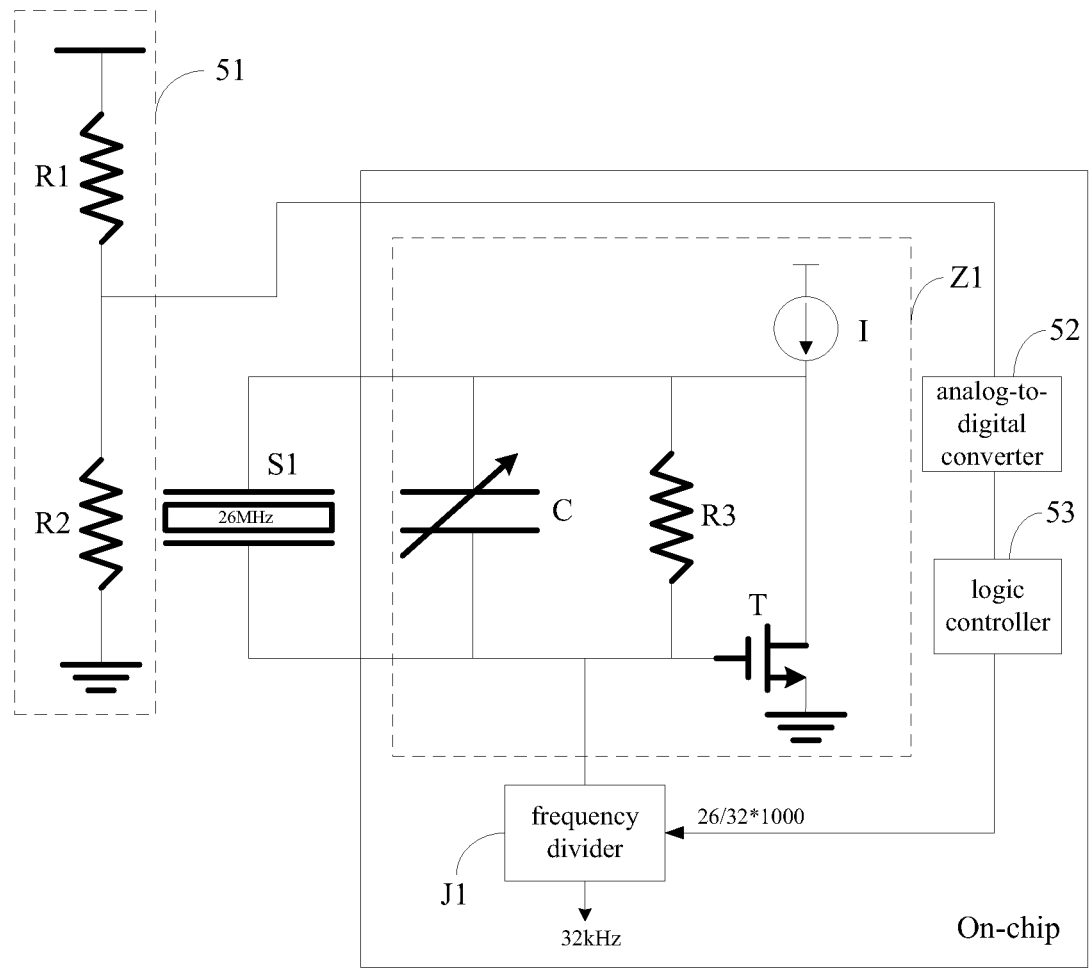
FIG. 5 schematically illustrates a structure of a clock circuit in a mobile communication terminal according to one embodiment of the present disclosure.

Referring to FIG. 5, a clock circuit of a mobile communication terminal according to one embodiment of the present disclosure is illustrated, which is adapted to achieve slow-clock calibration with a reduced number of crystals (i.e. reduced costs). The clock circuit includes a crystal S1, an oscillating circuit Z1, and a frequency divider J1. The clock circuit further includes a temperature measuring module 51, an analog-to-digital converter 52 electrically connected with the temperature measuring module 51, and a logic controller 53 which electrically connects the analog-to-digital converter 52 and the frequency divider J1.

The temperature measuring module 51 is configured to measure and output a current temperature of the crystal S1.

The analog-to-digital converter 52 is configured to convert an analog signal output from the temperature measuring module 51 into a digital signal for being further processed. In some embodiments, the analog signal may indicate information corresponding to the current temperature of the crystal S1.

The logic controller 53 is configured to: obtain the current temperature of the crystal S1; search, by taking a value of the current temperature as an index value, a preset data base for a unique frequency-divide coefficient corresponding to the current temperature; if the unique frequency-divide coefficient corresponding to the current temperature is found in the preset data base, input the frequency-divide coefficient into the frequency divider J1; and if the unique frequency-divide coefficient corresponding to the current temperature is not found in the preset data, obtain an actual sleep length of the mobile communication terminal after the mobile communication terminal is awake and in synchronization with a base station, if the actual sleep length is not equal to a required sleep length, calculate a required frequency-divide coefficient of the frequency divider J1 under the current temperature, and update the data base according to the required frequency-divide coefficient, and if the actual sleep length is equal to the required sleep length, update the data base according to a current frequency-divide coefficient used by the frequency divider J1.

In some embodiments, the oscillating circuit Z1, the frequency divider J1, the analog-to-digital converter 52 and the logic controller 53 are disposed on-chip. The temperature measuring module 51 and the crystal S1 are disposed off-chip, as shown in FIG. 5. It should be noted that, all these components may be disposed by other ways which should not taken as a limitation to the present disclosure.

Keep referring to FIG. 5, the temperature measuring module 51 is configured into a topological structure. Specifically, the temperature measuring module 51 includes a first resistor R1 and a second resistor R2; wherein the second resistor R2 is a thermo-sensitive resistor disposed close to or attached to the crystal S1; wherein the second resistor R2 has a first end connected to ground, and a second end connected with a power source via the first resistor R1; and the first resistor R1 and the second resistor R2 have a common end which serves as an output end of the temperature measuring module 51. The temperature measuring module 51 uses the first resistor R1 and the second resistor R2 to form a voltage-divide resistor. Accordingly, the temperature of the crystal S1 can be measured, as resistance of the thermo-sensitive resistor changes with change of the temperature.

In some embodiments of the present disclosure, as shown in FIG. 5, the oscillating circuit Z1 is also configured into a topological structure. Specifically, the oscillating circuit Z1 includes a capacitor C1, a third resistor R3, a current source I and a triode T; wherein an output terminal of the current source I is connected with a collector of the triode T, and is connected with a base of the triode T via an inductor L; wherein an emitter of the triode T is connected with ground; and wherein the capacitor C and the inductor L are connected in parallel.

In some embodiments of the present disclosure, as shown in FIG. 5, frequencies of the high-frequency clock signal and the slow-clock signal, which are applied by the mobile communication terminal, are respectively 26 MHz and 32 MHz. Therefore, the crystal S1 is a 26M high frequency crystal, and an initial value of the frequency-divide coefficient of the frequency divider J1 is 26/32*1000.

Moreover, according to one embodiment of the present disclosure, a mobile communication terminal is provided, which includes any one of the clock circuits as recited above. Thus, the mobile communication terminal can achieve slow-clock calibration with reduced crystal costs. The mobile communication terminal may be a cell phone, or any other mobile terminal which is not limited by the present disclosure.

Accordingly, in the present disclosure, given an oscillating frequency of the crystal varies with a temperature, a data base (e.g. a frequency-divide coefficient table) can be established, where the data base indicates a correlation between temperatures of the crystal and frequency-divide coefficients. Therefore, a frequency-divide coefficient corresponding to a current temperature of the crystal, i.e., the required frequency-divide coefficient, can be found in the data base (e.g. the frequency-divide coefficient table) by taking a value of the current temperature as an index value. Thereafter, the frequency-divide coefficient found in the data base (e.g. the frequency-divide coefficient table) is input into the frequency divider. Thus, the frequency divider can obtain a low-clock signal with a desired frequency. In such a way, a temperature based slow-clock calibration process can be realized by using the crystal itself without requiring an extra crystal. Therefore, costs of the crystal can be reduced.

It should be noted that, embodiments of the present disclosure are illustrated by focusing on differences from other embodiments, thus common parts can refer to corresponding illustrations of other embodiments. In the present disclosure, descriptions of the calibration unit, the clock circuit and the mobile communication terminal are simplified, as they have some common parts with the calibration method. Thus, these common parts can refer to corresponding disclosure relating to the calibration method.

Although the present disclosure has been disclosed above with reference to preferred embodiments thereof, it should be understood by those skilled in the art that various changes may be made without departing from the spirit or scope of the disclosure. Accordingly, the present disclosure is not limited to the embodiments disclosed.

What is claimed is:

1. A slow-clock calibration method for a clock circuit of a mobile communication terminal, where the clock circuit comprises a crystal, an oscillating circuit and a frequency divider, comprising:
    obtaining a current temperature of the crystal;
    searching, by taking a value of the current temperature as an index value, a preset data base for a unique frequency-divide coefficient corresponding to the current temperature of the crystal;
    if the unique frequency-divide coefficient corresponding to the current temperature of the crystal is found in the data base, inputting the unique frequency-divide coefficient into the frequency divider; and
    if the unique frequency-divide coefficient corresponding to the current temperature of the crystal is not found in the data base, obtaining an actual sleep length of the mobile communication terminal when the mobile communication terminal is awake and in synchronization with a base station, if the actual sleep length of the mobile communication terminal is not equal to a required sleep length, calculating a required frequency-divide coefficient of the frequency divider under the current temperature and updating the data base with the required frequency-divide coefficient, and if the actual sleep length of the mobile communication terminal is equal to the required sleep length, updating the data base with a current frequency-divide coefficient used by the frequency divider.

2. The slow-clock calibration method according to claim 1, wherein calculating the required frequency-divide coefficient comprises calculating the required frequency-divide coefficient according to Equation (1):

$$k\_cal = k\_def * T\_req / T\_real \qquad \text{Equation (1)}$$

where k_def represents the current frequency-divide coefficient used by the frequency divider; T_req represents the required sleep length of the mobile communication terminal; T_real represents the actual sleep length of the mobile communication terminal; and k_cal represents the required frequency-divide coefficient of the frequency divider under the current temperature.

3. A slow-clock calibration circuitry for a clock circuit of a mobile communication terminal, where the clock circuit comprises a crystal, an oscillating circuit and a frequency divider, comprising:
    a temperature-acquiring circuitry configured to obtain a current temperature of the crystal;
    a searching circuitry configured to search, by taking a value of the current temperature as an index value, a preset data base for a unique frequency-divide coefficient corresponding to the current temperature of the crystal;

a first processing circuitry configured to: if the unique frequency-divide coefficient corresponding to the current temperature of the crystal is found in the data base, input the unique frequency-divide coefficient into the frequency divider;

a second processing circuitry configured to: if the unique frequency-divide coefficient corresponding to the current temperature of the crystal is not found in the data base, obtain an actual sleep length of the mobile communication terminal when the mobile communication terminal is awake and in synchronization with a base station, if the actual sleep length of the mobile communication terminal is not equal to a required sleep length, calculate a required frequency-divide coefficient of the frequency divider under the current temperature and update the data base with the required frequency-divide coefficient, and if the actual sleep length of the mobile communication terminal is equal to the required sleep length, update the data base with a current frequency-divide coefficient used by the mobile communication terminal.

4. The slow-clock calibration unit according to claim 3, wherein the second processing unit is configured to calculate the required frequency-divide coefficient according to Equation (1):

$$k\_cal = k\_def * T\_req / T\_real \qquad \text{Equation (1)}$$

where k_def represents the current frequency-divide coefficient used by the frequency divider; T_req represents the required sleep length of the mobile communication terminal; T_real represents the actual sleep length of the mobile communication terminal; and k_cal represents the required frequency-divide coefficient of the frequency divider under the current temperature.

5. A clock circuit of a mobile communication terminal, comprising:
a crystal;
an oscillating circuit;
a frequency divider;
a temperature measuring module configured to measure and output a current temperature of the crystal;
an analog-to-digital converter electrically connected with the temperature measuring module; and
a logic controller which electrically connects the analog-to-digital converter with the frequency divider and is configured to:
obtain the current temperature of the crystal,
search, by taking a value of the current temperature as an index value, a preset data base for a unique frequency-divide coefficient corresponding to the current temperature of the crystal,
if the unique frequency-divide coefficient corresponding to the current temperature of the crystal is found in the data base, input the unique frequency-divide coefficient into the frequency divider, and
if the unique frequency-divide coefficient corresponding to the current temperature of the crystal is not found in the data base, obtain an actual sleep length of the mobile communication terminal when the mobile communication terminal is awake and in synchronization with a base station, if the actual sleep length of the mobile communication terminal is not equal to a required sleep length, calculate a required frequency-divide coefficient of the frequency under the current temperature and update the data base with the required frequency-divide coefficient, and if the actual sleep length of the mobile communication terminal is equal to the required sleep length, update the data base with a current frequency-divide coefficient used by the mobile communication terminal.

6. The clock circuit according to claim 5, wherein the temperature measuring module comprises a first resistor and a second resistor;
wherein the second resistor is a thermo-sensitive resistor disposed close to or attached to the crystal;
wherein the second resistor has a first end connected to ground, and a second end connected with a power source via the first resistor; and
wherein the first resistor and the second resistor have a common end which serves as an output end of the temperature measuring module.

7. The clock circuit according to claim 5, wherein the oscillating circuit comprises a capacitor, an inductor, a third resistor, a current source and a triode; wherein an output terminal of the current source is connected with a collector of the triode, and is connected with a base of the triode via the inductor; wherein an emitter of the triode is connected to ground; and wherein the capacitor and the inductor are connected in parallel.

8. The clock circuit according to claim 5, wherein the crystal is a 26M high frequency crystal; and wherein the frequency divider has an initial frequency-divide coefficient of 26/32*1000.

9. A mobile communication terminal, comprising a clock circuit which comprises:
a crystal;
an oscillating circuit;
a frequency divider;
a temperature measuring module configured to measure and output a current temperature of the crystal;
an analog-to-digital converter electrically connected with the temperature measuring module; and
a logic controller which electrically connects the analog-to-digital converter with the frequency divider and is configured to:
obtain the current temperature of the crystal,
search, by taking a value of the current temperature as an index value, a preset data base for a unique frequency-divide coefficient corresponding to the current temperature of the crystal,
if the unique frequency-divide coefficient corresponding to the current temperature of the crystal is found in the data base, input the unique frequency-divide coefficient into the frequency divider, and
if the unique frequency-divide coefficient corresponding to the current temperature of the crystal is not found in the data base, obtain an actual sleep length of the mobile communication terminal when the mobile communication terminal is awake and in synchronization with a base station, if the actual sleep length of the mobile communication terminal is not equal to a required sleep length, calculate a required frequency-divide coefficient of the frequency divider under the current temperature and update the data base with the required frequency-divide coefficient, and if the actual sleep length of the mobile communication terminal is equal to the required sleep length, update the data base with a current frequency-divide coefficient used by the mobile communication terminal.

10. The mobile communication terminal according to claim 9, wherein the temperature measuring module comprises a first resistor and a second resistor;
- wherein the second resistor is a thermo-sensitive resistor disposed close to or attached to the crystal;
- wherein the second resistor has a first end connected to ground, and a second end connected with a power source via the first resistor; and
- wherein the first resistor and the second resistor have a common end which serves as an output end of the temperature measuring module.

11. The mobile communication terminal according to claim 9, wherein the oscillating circuit comprises a capacitor, an inductor, a third resistor, a current source and a triode; wherein an output terminal of the current source is connected with a collector of the triode, and is connected with a base of the triode via the inductor; wherein an emitter of the triode is connected to ground; and wherein the capacitor and the inductor are connected in parallel.

12. The mobile communication terminal according to claim 9, wherein the crystal is a 26M high frequency crystal; and wherein the frequency divider has an initial frequency-divide coefficient of 26/32*1000.

13. The mobile communication terminal according to claim 9, wherein the mobile communication terminal is a cell phone.

* * * * *